(12) United States Patent
Chung et al.

(10) Patent No.: US 7,501,966 B2
(45) Date of Patent: Mar. 10, 2009

(54) DIGITAL-TO-ANALOG CONVERTER CELL

(75) Inventors: Shine Chung, Taipei Hsien (TW); Fu-Lung Hsueh, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 11/691,853

(22) Filed: Mar. 27, 2007

(65) Prior Publication Data
US 2008/0238744 A1 Oct. 2, 2008

(51) Int. Cl.
*H03M 1/00* (2006.01)
(52) U.S. Cl. ............................ 341/136; 341/144
(58) Field of Classification Search ............ 341/136, 341/144, 133
See application file for complete search history.

(56) References Cited

U.S. PATENT DOCUMENTS 7,015,846 B2 * 3/2006 Lin ............................. 341/144
7,129,878 B1 * 10/2006 Shiu et al. .................... 341/154

* cited by examiner

*Primary Examiner*—Brian Young
(74) *Attorney, Agent, or Firm*—K & L Gates LLP

(57) ABSTRACT

A DAC cell comprising: two or more PMOS core devices coupled in series between a power supply and a steering node; a first core transistor coupled between the steering node and a complementary power supply line and controlled by a control signal; and a second core transistor coupled between the steering node and an output of the DAC cell and controlled by a logical inverse of the control signal, wherein the control signal and its logical inverse direct a current from the steering node to either the complementary power supply line or to the output of the DAC cell based on the control signal.

16 Claims, 4 Drawing Sheets

DIGITAL-TO-ANALOG CONVERTER CELL

BACKGROUND

The present invention relates generally to a digital-to-analog converter (DAC) cell, and more particularly to a DAC cell constructed from core devices.

Digital-to-analog conversion is a process for converting information from a digital signal into an analog signal such as a voltage or a current. The digital signal can usually be represented as a binary number. A binary number system represents numeric values using two symbols, typically 0 and 1. Binary numbers are characterized by having different weighting for each bit (or signal). For example, a four-bit binary number has a least significant bit (bit 0) and a most significant bit (bit 3) whereby each bit is twice the value of the next least significant bit. For example, bit 1 is twice the value of bit 0, and bit 2 is twice the value of bit 1.

FIG. 1 shows a conventional current-steering type single-bit DAC cell 100 which can be used to convert a digital signal to an analog equivalent. In this DAC cell 100, the transistors M1 and M2 are connected in series to increase the output impedance. The biasing voltages VB1 and VB2 are established so that the devices M1 and M2 collectively act as a current source that, upon the appropriate control by VB1 and VB2, will provide a constant current to the cell. The devices M3 and M4 act as steering transistors such that the current is directed to either the output (Iout) or to a complementary supply voltage (such as a ground or Vss) according to the state of a control signal A (and its complement). The control signal A may be generated externally by a digital input signal to be applied to the DAC cell. In practice, the output current from this cell would normally be directed to a resistive element to create a voltage.

In various chip designs, there are at least two sets of power supplies that provide different levels of power to different parts of the chip. For instance, a core voltage (Vddcore) is provided to a "core" of the chip so that the components of the core, usually small geometry devices, can operate under a relatively lower voltage without a breakdown. On the other hand, a relatively higher I/O voltage (Vddio) is provided for the circuit components that interact with external devices which are all operating at the higher voltage level. To realize a conventional DAC cell 100, the transistors M1 through M4 are input/output (I/O) devices designed to operate at higher voltages than the core voltage used internally on the integrated circuit. The core devices are generally small devices having a thinner gate oxide thickness (e.g., less than 3 nm) and a lower operating voltage (typically less than 2.5 volt) than the I/O devices. Accordingly the I/O devices can sustain higher voltages such as 2.5V or 3.3V and have a higher threshold voltage of about 0.6 to 0.7 volt, whereas core devices can only sustain up to 1.4 volt and their threshold voltages are about 0.4 volt. Thus in FIG. 1 the supply voltage Vddio is normally set at 2.5 or 3.3 volt to provide adequate operational and noise margins. The transistors M1, M2, M3 and M4 are all built in 2.5V/3.3V I/O devices. The transistors M1 and M2 are cascoded and properly biased by bias voltages VB1 and VB2 to produce a high output impedance.

In view of the foregoing, the DAC cells are normally operated at a high voltage of 2-3 volt for sufficient dynamic range and I/O devices are used to construct the DAC cell. As such, what is needed is a DAC cell comprised of core devices having an acceptable dynamic range and output impedance while using less integrated circuit area.

SUMMARY

The present disclosure provides for a DAC cell comprising: two or more PMOS core devices coupled in series between a power supply and a steering node; a first core transistor coupled between the steering node and a complementary power supply line and controlled by a control signal; and a second core transistor coupled between the steering node and an output of the DAC cell and controlled by a logical inverse of the control signal, wherein the control signal and its logical inverse direct a current from the steering node to either the complementary power supply line or to the output of the DAC cell based on the control signal.

The construction and method of operation of the invention, however, together with additional objectives and advantages thereof will be best understood from the following description of specific embodiments when read in connection with the accompanying drawings.

DESCRIPTION

Figure 1:
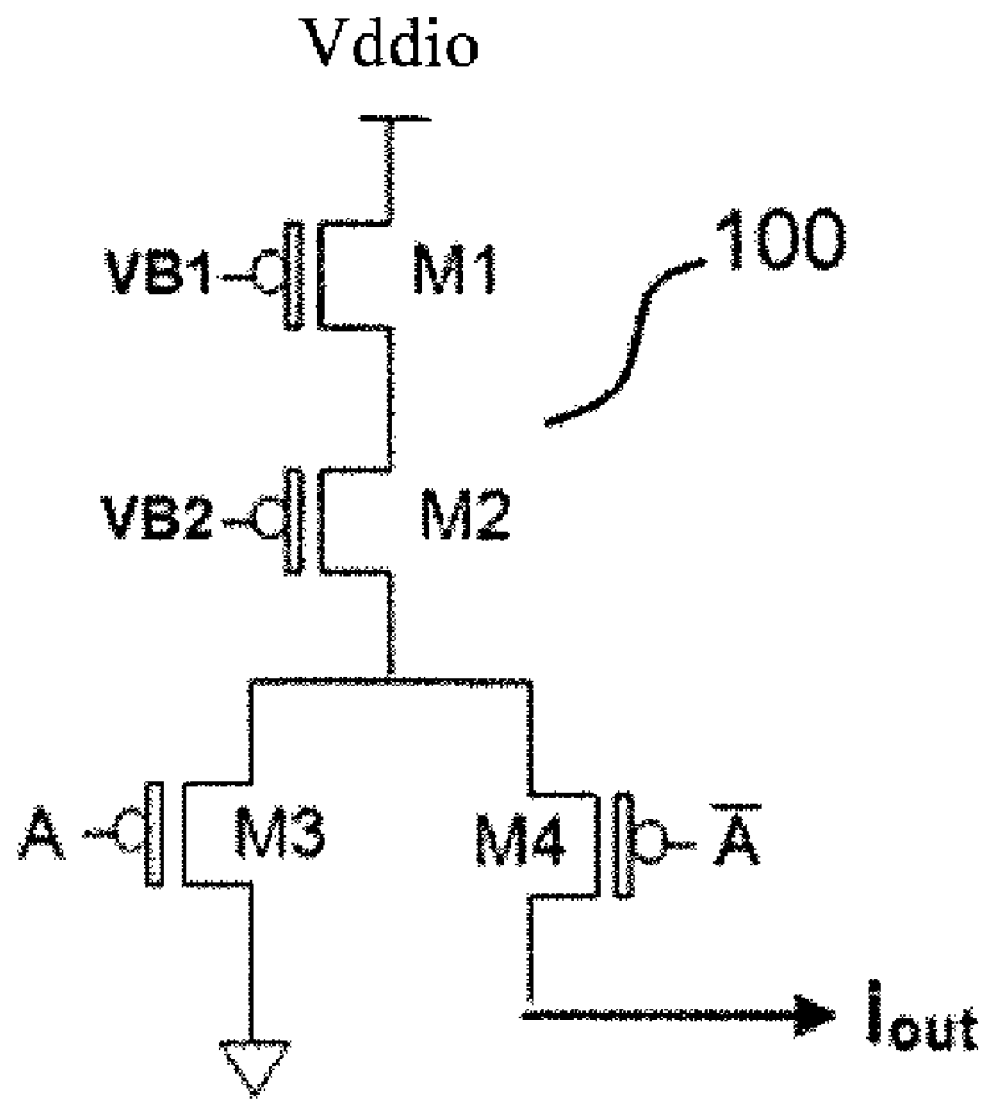
FIG. 1 illustrates a conventional DAC cell.

Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Figure 2:
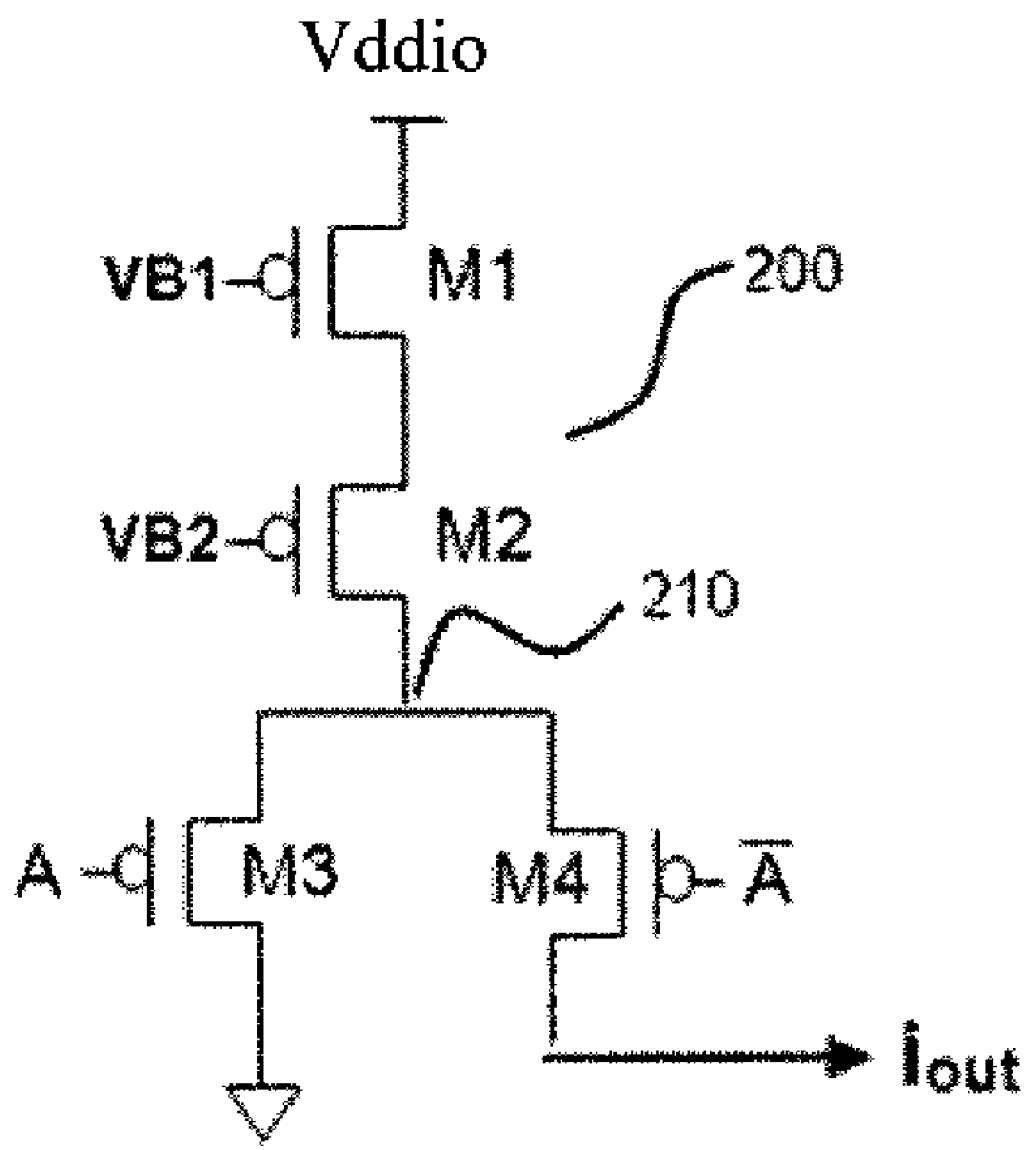
FIG. 2 illustrates one embodiment of the current invention using core devices in a DAC cell.

FIG. 2 illustrates one embodiment of the current invention. The current-steering DAC cell 200 is constructed of four PMOS core devices. Although PMOS devices are shown in this embodiment, it would be in the spirit of this invention to use other semiconductor core devices to construct the current-steering DAC cell. The PMOS device M1 is a core device with a source connected to a core voltage supply (Vddcore), a drain connected to the source of PMOS device M2 and a gate connected to a biasing voltage VB1. The PMOS device M2 is a core device having a drain connected to the sources of PMOS devices M3 and M4. The gate of M2 is connected to a biasing voltage VB2. The PMOS device M3 is a core device having its drain connected to a complementary supply (such as a ground or Vss) and its gate is controlled by a signal A. The signal A can be derived from a digital input signal to the DAC. The PMOS device M4 is a core device having its gate connected to the logical inverse of the signal A. In this embodiment, the drain of M4 provides the output of the DAC cell 200.

In view of the foregoing, the biasing voltage VB1 and the biasing voltage VB2 are set such that a current is presented to the steering transistors M3 and M4. The biasing voltages VB1 and VB2 are adjusted to properly bias the devices M1 and M2 to be within the operational range of core devices. In the operational range of core devices, the relative voltages at all terminals of both devices M1 and M2 are less than 1.4 volt and both device M1 and device M2 are operating in their saturation regions.

The DAC cell 200 is controlled by the signal A and its logical inverse. Depending on the state of the signal A, the current will be directed to the output of the DAC cell 200 by the PMOS device M4 or to a complementary power supply by the PMOS device M3.

If the current embodiment is constructed of devices in the 90 nm range or smaller, some leakage may result. Using high-K dielectrics so the gate oxide layer is thicker can prevent this undesirable side effect. Among other materials, the high-k gate dielectric layer may be constructed from a Zirconium, Aluminum or Titanium containing layer such as $ZrO_2$, $Al_2O_3$, $TiO_2$, $HfO_2$, or HfTaO, or a layer constructed from a two or more of the above materials.

This embodiment illustrates several advantages to the current invention. Firstly the DAC cell will be smaller. A chip or integrated circuit will generally have a logic circuit at the core of the chip and an I/O circuit at periphery region. In general, transistors in the logic circuit, such as those used in the DAC cell 200, have a channel length less than the transistors in the I/O circuit. Preferably, the transistors of core devices in the DAC cell 200 have a channel length less half of the channel length of an I/O transistor. For example in 90 nm technology, the transistors of the core devices in DAC cell 200 have a channel length less than about 100 nm while the transistors in I/O region have a channel length less than about 0.25 um. Additionally, the transistors of the core devices in DAC cell may have a different size gate dielectric layer from the transistors in the I/O region making them smaller as well. For example the core devices in the DAC cell may have a gate dielectric layer less than about 20 angstroms.

In the embodiment shown, if the minimum channel lengths for 90 nm core and I/O devices are 0.10 um and 0.25 um respectively, using core devices in the DAC cells with a channel length of 0.10 um can scale down the DAC cell size as a ratio to $(0.1/0.25)^2$, or 0.16. Thus using core devices for the DAC cell can result in a DAC cell of about $\frac{1}{6}^{th}$ the size of a conventional DAC cell.

The second advantage of the current embodiment is speed. In general, the device switch delays from one generation to the next can be improved to only 70%. If thin-oxide devices are used, the switch delays can be improved to about half, or $(0.7)^2=0.49$. This means the sampling rate for the DAC circuit can be doubled.

The third advantage to the current embodiment is that power consumption can be effectively reduced. Since the DAC cell size can be smaller when implemented with core devices, the total gate capacitance and parasitic capacitance will be reduced thus lowering power consumption.

One having skill in the art would recognize that with a DAC output of 1.275 volt, and the PMOS devices M1 and M2 operating in the saturation region, the core devices will not be subject to voltages harmful to the devices. One having skill in the art would also appreciate that using core devices to construct DAC cells decreases the amount of area needed on an integrated circuit. Other advantages include faster operation because of the smaller devices and less power consumption.

References in the specification to "one embodiment", "an embodiment", "an example embodiment", etc., indicate that the embodiment described may include a particular feature, structure or characteristic, but every embodiment may not necessarily include the particular feature, structure or characteristic. Moreover, such phrases are not necessarily referring to the same embodiment. Further, when a particular feature, structure or characteristic is described in connection with an embodiment, it is submitted that it is within the knowledge of one of ordinary skill in the art to effect such feature, structure or characteristic in connection with other embodiments whether or not explicitly described. Parts of the description are presented using terminology commonly employed by those of ordinary skill in the art to convey the substance of their work to others of ordinary skill in the art.

Figure 3:
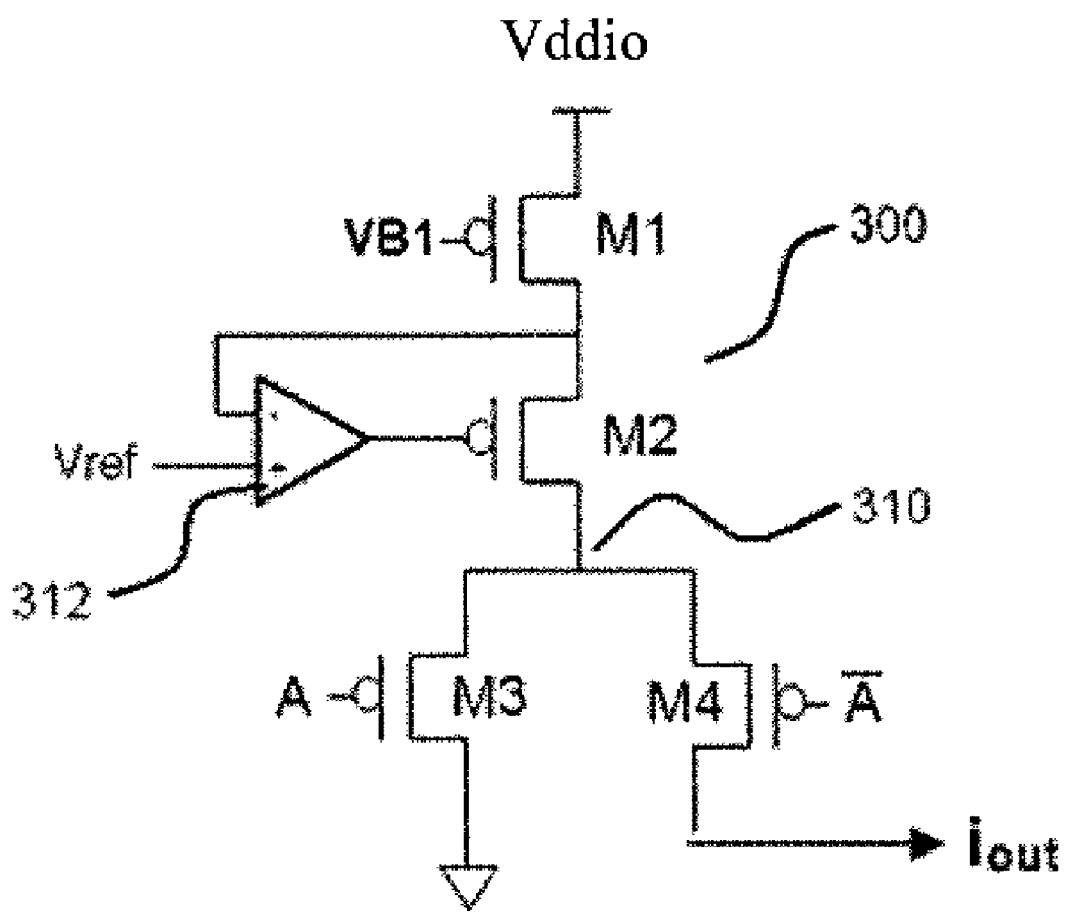
FIG. 3 illustrates a second embodiment of the current invention using an opamp.

FIG. 3 shows another embodiment of the current invention using an opamp to increase the output impedance. In the DAC cell 200 of FIG. 2 the output impedance at node 210 is approximately given by ro1*gm2*ro2. Where gm2 is the transconductance of M2 and ro1 and ro2 are the output impedances of M1 and M2 respectively. In this embodiment the opamp 312 increases the output impedance at node 310 such that the output impedance is approximately given by ro1*gm2*ro2*G where G is the gain of the opamp 312. In this embodiment the opamp 312 can be constructed from core devices. The inverting input of the opamp is connected to the source of M2 and the noninverting input of the opamp 312 is connected to a reference voltage (Vref). The output of the opamp 312 is connected to the gate of M2 and Vref is set such that the PMOS device M2 operates within the operational range or core devices. The reference voltage Vref may be supplied by a band-gap reference also constructed from core devices.

Figure 4:
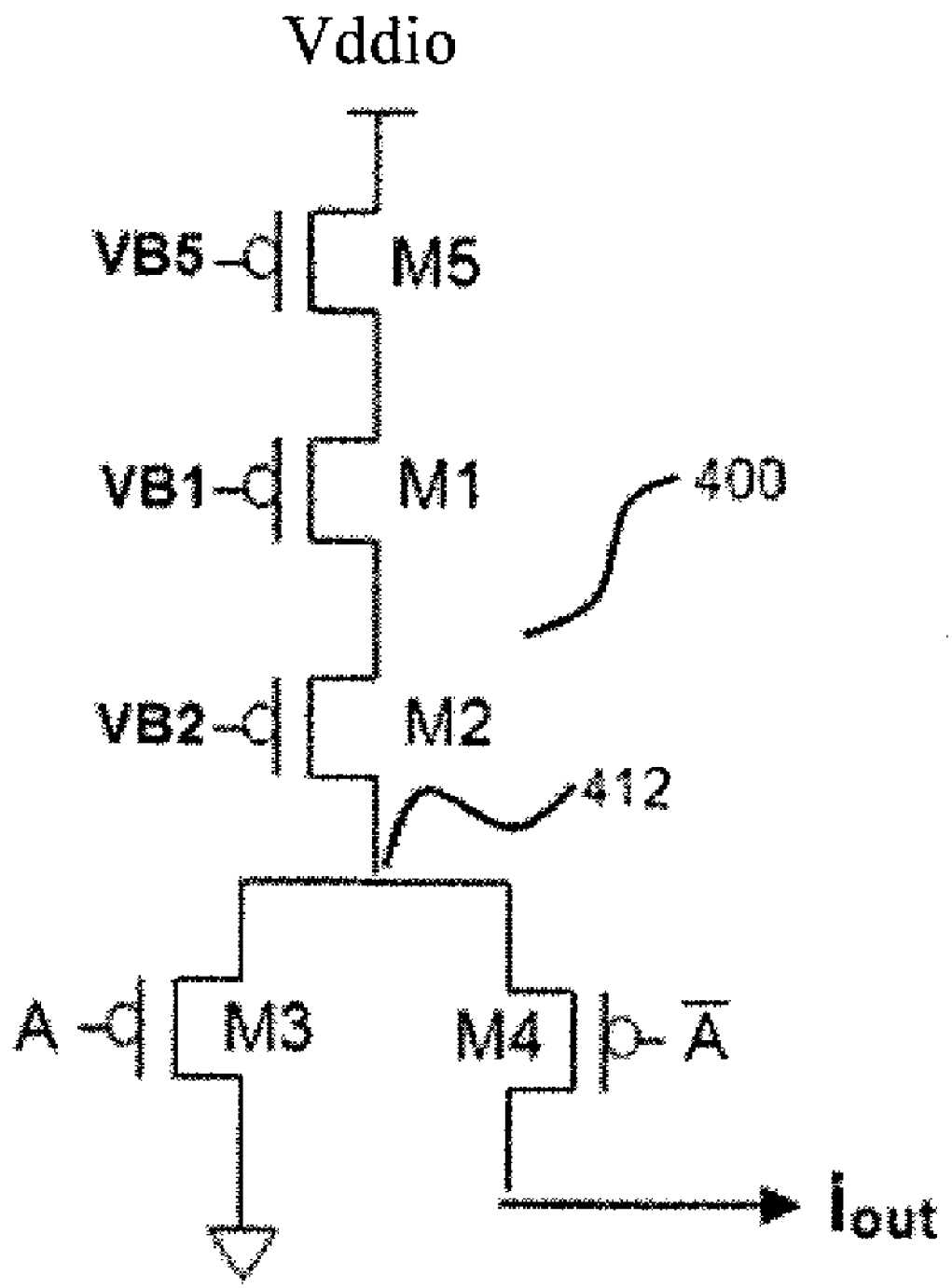
FIG. 4 illustrates another embodiment of the current invention using core device in a DAC cell.

FIG. 4 illustrates another embodiment of the present invention using an additional transistor to increase the output impedance. The DAC cell 400 is comprised of five core PMOS transistors; however, it would be in the spirit of the current invention to construct the DAC cell 400 using different semiconductor devices. In the DAC cell 400 the PMOS device M5 is a core device having its source connected to a positive I/O voltage supply (Vddio). The drain of the PMOS device M5 is connected to the source of the PMOS device M1 and the gate of the PMOS device M5 is connected to a biasing voltage VB5. The PMOS device M1 is a core device with a source connected to the drain of PMOS device M5, a drain connected to the source of PMOS device M2 and a gate connected to a biasing voltage VB1. The PMOS device M2 is a core device having a drain connected at node 412 to the sources of both PMOS devices M3 and M4. The gate of M2 is connected to a biasing voltage VB2. The PMOS device M3 is a core device having a drain connected to a complementary supply and a gate controlled by the signal A. The signal A is derived from a digital input signal to the DAC. The PMOS device M4 is a core device having a gate connected to the logical inverse of the signal A. A drain of M4 provides an output of the DAC cell.

The biasing voltages VB1, VB2 and VB3 are set to operate their respective transistors within the operational range or core devices such that the devices M5, M1 and M2 provide a constant current source to the steering transistors M3 and M4. In this embodiment, the output of the cell is controlled by controlling signal A, such that either the PMOS device M4 is directing the current to the output or the PMOS device M3 is directing the current to the complementary supply.

One having skill in the art would recognize that in this embodiment the output impedance is given by: ro5*gm1*ro1*gm2*ro2 where ro5, ro1 and ro2 are the output impedances of the devices M5, M1 and M2 respectively, and gm1 and gm2 are the transconductances of the devices M1 and M2 respectively. Thus this embodiment provides a DAC cell that uses less integrated circuit area and still provides an acceptable output impedance.

If the current embodiment is constructed of devices in the 90 nm range or smaller, some leakage may result. Using high-K dielectrics so the gate oxide layer is thicker can prevent this undesirable side effect. One having skill in the art would recognize that with a DAC output of 1.275 volt, and with the PMOS devices M5, M1, and M2 operating in the saturation region, the core devices will not be subject to voltages harmful to the devices.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. An integrated circuit comprising:
   at least one digital to analog converter (DAC) cell having a first plurality of MOS transistors, wherein the first plurality of MOS transistors are core devices; and
   at least one input/output (I/O) region having a second plurality of MOS transistors coupled to at least one DAC cell,
   wherein the channel length of the first plurality of MOS transistors is less than half of the channel length of the second plurality of MOS transistors.

2. The integrated circuit of claim 1 wherein each of the first plurality of MOS transistors comprises a dielectric layer made of one or more high-K materials including $ZrO_2$, $Al_2O_3$, $TiO_2$, $HfO_2$, or HfTaO, a combination thereof for reducing leakage current.

3. The integrated circuit of claim 1 wherein the channel length of the first plurality of MOS transistors is 100 nm or less.

4. The integrated circuit of claim 1 wherein the channel length of the second plurality of MOS transistors is 0.25 um or less.

5. The integrated circuit of claim 1 wherein the gate dielectric layer thickness of the first plurality of MOS transistors is 30 angstroms or less.

6. The integrated circuit of claim 1 wherein the DAC cell further comprises an op-amp constructed from one or more MOS transistors with channel lengths less than half the channel lengths of the second plurality of MOS transistors.

7. The integrated circuit of claim 1 wherein the DAC cell further comprises a band-gap reference circuit constructed from one or more MOS transistors wit channel lengths less than half of the second plurality of MOS transistors.

8. A DAC cell comprising:
   two or more PMOS core devices coupled in series between a power supply and a steering node;
   a first core transistor coupled between the steering node and a complementary power supply line and controlled by a control signal; and
   a second core transistor coupled between the steering node and an output of the DAC cell and controlled by a logical inverse of the control signal,
   wherein the control signal and its logical inverse direct a current from the steering node to either the complementary power supply line or to the output of the DAC cell based on the control signal.

9. The DAC cell of claim 8 wherein the power supply is an I/O power supply.

10. The DAC cell of claim 8 wherein the two or more PMOS core devices are controlled to operate within the operational range of core devices, such that the relative voltages at all terminals of the two or more PMOS core devices are less than 1.4 volt and the two or more core devices are operating in their respective saturation regions.

11. A DAC cell comprising:
    a first PMOS core device having a source connected to a core supply voltage and a gate connected to a first bias voltage;
    a second PMOS core device having a source connected to a drain of the first PMOS core device and a gate connected to a second bias voltage;
    a third PMOS core device having a source connected to a drain of the second PMOS core device, a drain connected to a complementary supply voltage, and a gate connected to an input signal, and
    a fourth PMOS core device having a source connected to the drain of the second PMOS core device, a gate connected to a logical inverse of the input signal and a drain for providing an output of the DAC cell.

12. The DAC cell of claim 11 wherein the first bias voltage and the second bias voltage are set to operate the first PMOS core device and the second PMOS core device respectively within the operational range of core devices, such that the relative voltages at all terminals of the first PMOS core device and the second PMOS core device are less than 1.4 volt and both the first PMOS core device and the second PMOS core device are operating in their saturation regions.

13. The DAC cell of claim 11 further comprising: an opamp having an inverting input connected to the source of the second PMOS core device and a noninverting input connected to a reference voltage, with an the output of the opamp providing the second bias voltage.

14. The DAC cell of claim 11 wherein the first bias voltage is set to operate the first PMOS device within the operational range of core devices and the reference voltage is set to operate the second PMOS core device within the operational range of core devices, such that the relative voltages at all terminals of the first PMOS core device and the second PMOS core device are less than 1.4 volt and both the first PMOS core device and the second PMOS core device are operating in their saturation regions.

15. The DAC cell of claim 11 where the opamp is constructed from core devices.

16. The DAC cell of claim 11 wherein each of the core devices comprises a dielectric layer made of one or more high-K materials including $ZrO_2$, $Al_2O_3$, $TiO_2$, $HfO_2$, or HfTaO, or a combination thereof for reducing leakage current.

* * * * *